US005967328A

United States Patent [19]

Ziberna

[11] Patent Number: 5,967,328

[45] Date of Patent: Oct. 19, 1999

[54] PART CARRIER STRIP

[75] Inventor: Frank J. Ziberna, Elmhurst, Ill.

[73] Assignee: Dial Tool Industries, Inc., Addison, Ill.

[21] Appl. No.: 09/010,739

[22] Filed: Jan. 22, 1998

[51] Int. Cl.[6] .......................... B65D 85/90; H01L 23/02

[52] U.S. Cl. .......................... 206/714; 206/725; 206/820; 174/52.4

[58] Field of Search .......................... 206/713–717, 206/725, 820, 390, 479, 328, 329, 330, 331, 332, 333, 334; 174/52.4; 29/827, 835, 841

[56] References Cited

U.S. PATENT DOCUMENTS

| | | | |
|---|---|---|---|
| 3,331,497 | 7/1967 | Lunsford | 206/56 |
| 3,339,719 | 9/1967 | Bush | 206/56 |
| 3,417,865 | 12/1968 | Suverkropp et al. | 206/46 |
| 3,512,438 | 5/1970 | Burdge | 83/209 |
| 3,517,803 | 6/1970 | Frompovicz et al. | 206/56 |
| 3,523,608 | 8/1970 | Miller | 206/65 |
| 3,698,074 | 10/1972 | Helda et al. | 29/626 |
| 3,797,655 | 3/1974 | Boone et al. | 206/330 |
| 3,858,721 | 1/1975 | Boyer et al. | 206/330 |
| 3,913,195 | 10/1975 | Beaver | 29/25.35 |
| 4,024,953 | 5/1977 | Nailor, III | 206/714 |
| 4,118,859 | 10/1978 | Busler | 29/622 |
| 4,295,117 | 10/1981 | Lake et al. | 338/4 |
| 4,401,053 | 8/1983 | Riley | 118/721 |
| 4,418,815 | 12/1983 | Anderson et al. | 198/476 |
| 4,483,441 | 11/1984 | Akizawa et al. | 206/328 |
| 4,583,641 | 4/1986 | Gelzer | 206/330 |
| 4,621,486 | 11/1986 | Slavicek | 53/580 |
| 4,631,897 | 12/1986 | Slavicek | 53/399 |
| 4,633,370 | 12/1986 | Hamuro et al. | 361/380 |
| 4,712,675 | 12/1987 | Scholten et al. | 206/332 |
| 4,756,193 | 7/1988 | Luettgen | 73/756 |
| 4,757,895 | 7/1988 | Gelzer | 206/330 |
| 4,767,984 | 8/1988 | Bakker | 324/158 F |
| 4,781,953 | 11/1988 | Ball | 428/35 |
| 4,850,227 | 7/1989 | Luettgen et al. | 73/708 |
| 5,085,362 | 2/1992 | Art et al. | 228/49.1 |
| 5,119,934 | 6/1992 | Karasawa et al. | 206/330 |
| 5,263,241 | 11/1993 | Hart, Jr. et al. | 29/827 |
| 5,312,015 | 5/1994 | Gelzer | 221/72 |
| 5,361,901 | 11/1994 | Schenz et al. | 206/330 |
| 5,394,675 | 3/1995 | Yonehara | 53/410 |
| 5,472,085 | 12/1995 | Gelzer | 206/714 |
| 5,483,857 | 1/1996 | Ziberna | 83/104 |
| 5,524,765 | 6/1996 | Gutentag | 206/713 |
| 5,690,233 | 11/1997 | Kaneko | 206/714 |
| 5,725,930 | 3/1998 | Ziberna | 428/131 |

FOREIGN PATENT DOCUMENTS

| | | |
|---|---|---|
| 4-6055 | 2/1981 | Japan . |
| 5-305985 | 1/1986 | Japan . |

OTHER PUBLICATIONS

Two photographs of device entitled, “Continuous Belt”.

ITW Deltar mechanical drawing entitled “Carrier, Pressure Sensor, ” dated Oct. 30, 1990.

A photograph which dicloses a tape having a series of pockets, each of which includes a part therein.

*Primary Examiner*—Paul T. Sewell

*Assistant Examiner*—J. Mohandesi

*Attorney, Agent, or Firm*—Marshall, O’Toole, Gerstein, Murray & Borun

[57] ABSTRACT

A part carrier device for receiving and transporting component parts includes a flexible member capable of being flattened into a planar strip and having a plurality of part receiving areas. Each of the part receiving areas is defined or bounded by a plurality of part positioning tabs. Each of the part positioning tabs is positioned to abut an edge of a pre-formed part placed adjacent the part receiving area. Each of the part receiving areas is further being bounded on at least two opposing sides by a row of resiliently deflectable part retaining latches which releasably engaging the part. At least one of the latches in each row is positioned to overlie the surface of the part, while at least one of the latches in each row is positioned to underlie the surface of the part.

23 Claims, 4 Drawing Sheets

14
15
17
19
21
26
28
30
34
36
38
40
42
44
46
47
48

13
13-1
13-2
14
15
17
19
21
4
5
6

PART CARRIER STRIP

FIELD OF THE INVENTION

The present invention relates to a flexible strip for transporting preformed parts to an automated assembly device.

BACKGROUND OF THE INVENTION

Flexible part carrier strips for holding and transporting pre-formed parts are commonly employed in the automated manufacture of electronic and other components. Many electronic components are manufactured using robotic loaders and other automated assembly devices in order to maximize the efficiency of the production line. Automated assembly machines typically have a loading arm which retrieves the part from a pre-designated location and inserts the part in place on a component being assembled on the production line, such as an electronic circuit board. The part is then soldered, welded, or otherwise connected to the circuit board by another automated step further down the assembly line. Such automated assembly devices are commonly used in the construction of electronic circuit boards.

In order to maintain the efficiency of the production line, the component parts must be presented to the automated loader at a consistent pre-determined location, and at a consistent pre-determined orientation. Any deviations from the desired orientation or location will result in defective assembly of the final product. In order to ensure the proper presentation of the part to the loading device, most automated assembly lines utilize carrier strips, carrier tapes, or carrier trays to deliver a properly oriented part to the pickup point.

On a typical carrier tape or strip, the oriented parts are secured at precise intervals along a flexible continuous strip of plastic. The steps of forming the part and securing the part to the carrier strip is usually performed away from the automated assembly line. The strip holding the parts is then rolled, transported, and fed into a loading machine on the assembly line using a commercially available feeding device. For example, one type of carrier strip known under the tradename "GPAX" is described in U.S. Pat. Nos. 4,583,641 and 4,757,895. The GPAX structures disclose a carrier tape having a plurality of part receiving recesses and intervening slots punched along the length of the strip. The holes are adapted to engage legs, stubs, or leads on the part in order to ensure proper and secure positioning of the part on the tape. A plastic bonding tape which overlays the parts is pressed or stitched onto the carrier tape between adjacent parts in order to secure the parts in their respective recesses. However, many electrical parts are stamped from thin sheets of metal and hence are flat and very delicate.

Another carrier strip structure, known as "debossed tape and reel" consists of a plastic carrier tape with a plurality of recesses or pockets along the length thereof in which the parts are placed. A sealing tape is bonded over the length of the carrier tape in order to retain the parts within their respective pockets. The carrier tape is fed into the robotic loader, which peels away the sealing tape, removes the part, and then discharges both the carrier tape and the sealing tape to waste. Although the debossed tape and reel structure is better suited for flat parts than the GPAX type structure outlined above, and the two-part disposable nature of the tape and reel method is very expensive frequently requires human insertion of the parts into the recesses. Accordingly, there exists need for an improved and more economical flexible carrier tape which is well-suited for securing and transporting flat parts, and which is readily adaptable to automated loading and unloading.

SUMMARY OF THE INVENTION

The parts carrier according to the present invention is well suited to securing and transporting flat delicate parts, and is also well suited for automated loading and unloading of parts from the parts carrier. According to one aspect of the invention, the parts carrier includes a flexible strip, preferably of plastic, which can be flattened into a strip. The carrier includes a plurality of aligned part receiving areas, each of which is bounded on at least two sides by opposing rows of resiliently deflectable retaining latches which overlie the flat edges of the pre-formed part. A plurality of positioning tabs abut the edges of the part in order to maintain proper part orientation. The retaining latches are resiliently deflectable upwardly away from the surface of the strip, such as by an automated die, in order to permit automatic loading of the pre-formed part onto the strip. The carrier further includes an aperture through its surface in order to facilitate automatic unloading such as by a die machine which deflects the retaining latches in order to permit removal by a punch press or a vacuum pickup device. The carrier preferably includes a series of holes along each of its edge which engage the sprockets or cogs of an automated feeding device as is well known in the art.

In accordance with another aspect of the invention, the carrier tape includes opposing rows of retaining latches, with each row having at least one latch which overlies the edge of the part and at least one latch which underlies the surface of the part to prevent bending of the delicate part contained therein. Opposing rows of positioning tabs maintain proper orientation of the part on the carrier, and each retaining latch preferably includes a positioning tab as well. The positioning tabs are semi-circular cutouts which are stamped directly onto the surface of the carrier and which have an edge which abuts and aligns the edge of the part carried by the carrier. To load a part onto the carrier, a series of rods or protrusions in the loading device deflect the overlying tabs upwardly to a part receiving position, and the pre-formed part is stamped or punched into position on the surface of the carrier. After the rods are retracted the resilient retaining latches bend back into a part engaging position, and the carrier is advanced by the feeder to receive the next part.

An improved part carrier strip according to the present invention is readily adaptable to carry flat delicate parts, and is well suited for use with automated loading and unloading devices. Moreover, the present part carrier strip is not destroyed during the unloading process, and is thus reusable.

These and other advantages and features of the invention will become readily apparent to those skilled in the art upon a reading of the following description.

BRIEF DESCRIPTION OF THE DRAWINGS

In the course of the following detailed description, reference will be made to the attached drawings wherein like reference numerals identify like parts and wherein.

DETAILED DESCRIPTION OF THE PREFERRED EMBODIMENT

The embodiment described herein is not intended to limit the scope of the invention to the precise form disclosed. The embodiment has been chosen and described in order to explain the principles of the invention and its practical use in order to enable others skilled in the art to follow its teachings.

Figure 1:
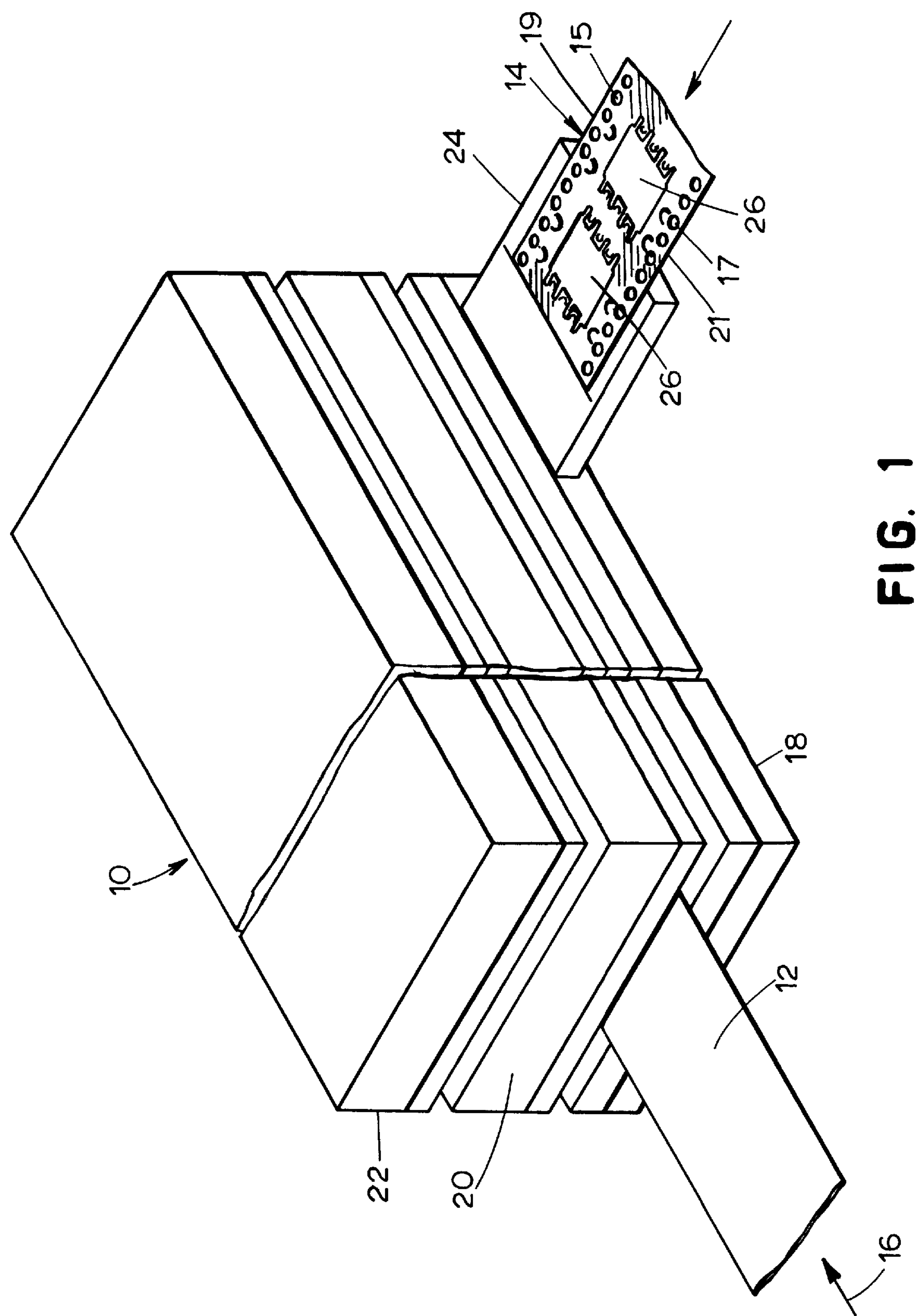
FIG. 1 is a fragmentary, isometric and diagrammatic view of a die for assembling a part into a carrier strip according to the present invention.
Figure 3:
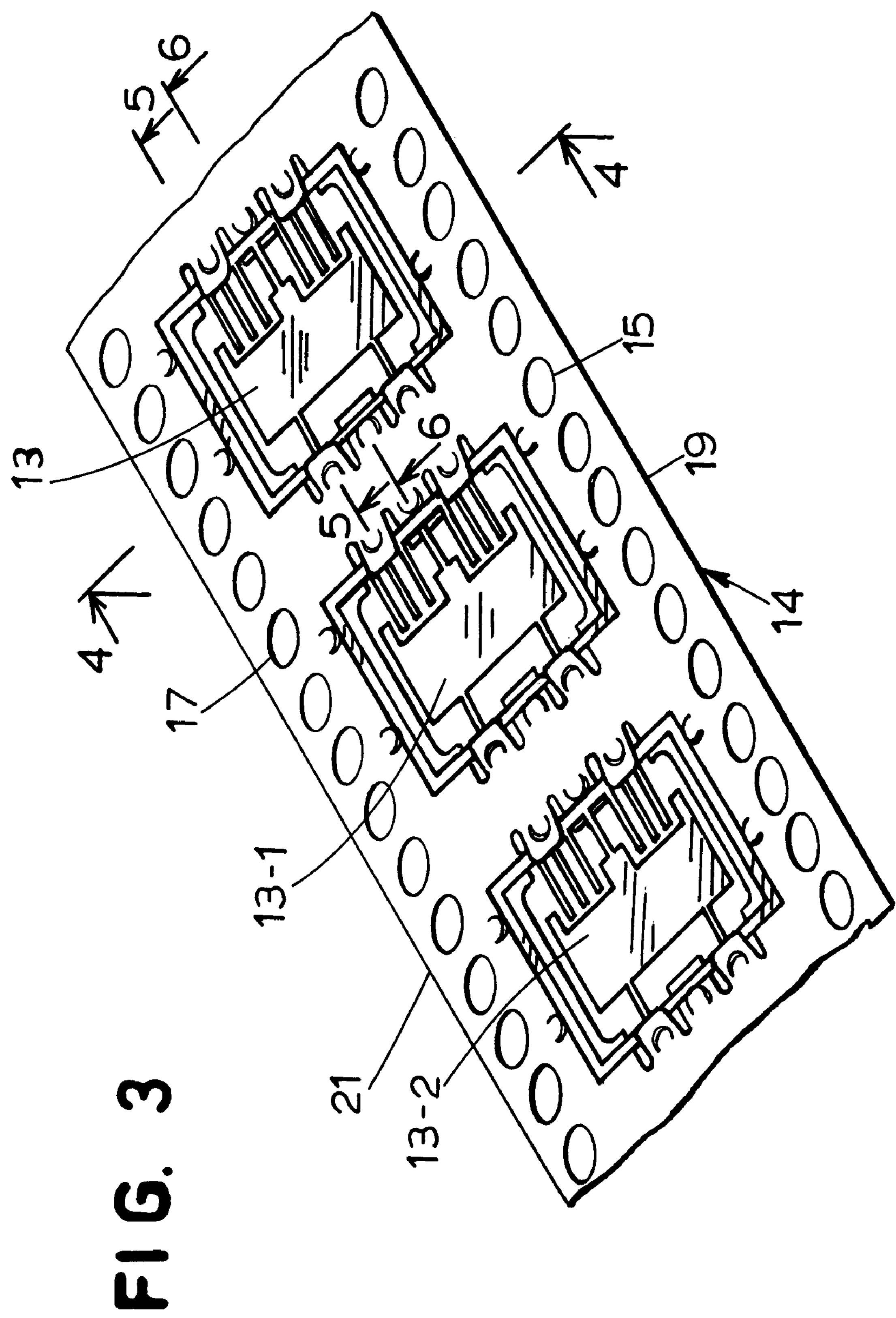
FIG. 3 is an enlarged fragmentary view in perspective similar to FIG. 2 but illustrating a generally planar or flat part secured within the part carrier strip.

Referring now to FIG. 1 of the drawings, a die 10 forms parts in a metal strip 12 and assembles the parts into a parts carrier strip 14 incorporating the features of the present invention. The metal strip 12 is fed in the input direction as shown by reference arrow 16 into a space between lower and intermediate die portions 18, 20, respectively. The die 10 further includes an upper portion 22 which is slidably connected to the intermediate die portion 20. The die portions, 18, 20 and 22 are interconnected by guides (not shown) which allow reciprocating movement of the intermediate die portion 20 and the upper die portion 22 relative to the lower die portion 18. The die 10 stamps the metal strip 12 into a plurality of distinct components or parts 13, which are secured to the parts carrier strip 14 as will be explained in greater detail below. As shown in FIG. 3, part 13 is preferably flat, although the parts carrier strip 14 is equally well suited to securing a non-planar part having a flat outer edge or flat portions on the outer edge.

Preferably, the carrier strip 14 is fabricated of polypropylene or any other suitable plastic or other material and is two inches wide and 0.020 inches thick. Other dimensions are possible, depending on the requirements of the particular application. The carrier strip 14 may be fed by any suitable means, and, in the preferred embodiment is fed into the die by an airoperated feeding device 24 which may comprise, for example, a model B4 feeder manufactured by Rapid Air Corporation of Rockford, Ill.

Figure 2:
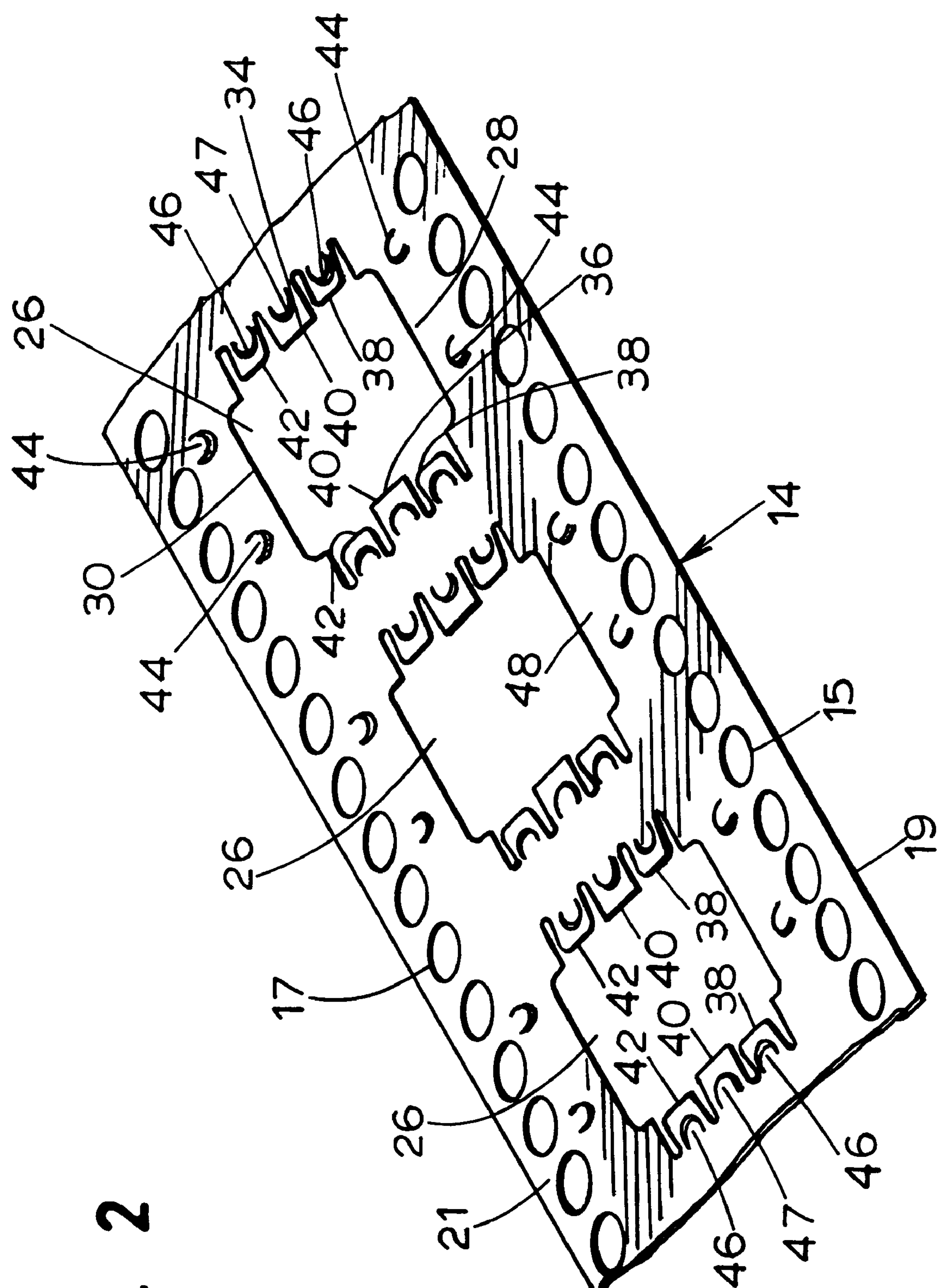
FIG. 2 is an enlarged fragmentary view in perspective of a part carrier strip incorporating features of the present invention.

As seen in FIG. 2, the carrier strip 14 is generally planar and includes a plurality of part-receiving apertures 26. First and second series of marginal positioning holes 15, 17 are located on either side of the apertures 26 adjacent the edges 19, 21, respectively, of the strip 14. Preferably, the holes of each series 15, 17 are regularly spaced, and are precisely located with respect to the apertures 26 to permit accurate placement of the carrier strip 14 during insertion of the part 13 therein. Preferably, although not necessarily, each aperture 26 is generally rectangular or square.

Each aperture 26 includes four sidewalls 28, 30, 32 and 34. Sidewall 28, 30 are generally straight, while sidewalls 32, 34 each include a plurality of latch members 38, 40 and 42 which will be described in greater detail below. A plurality of generally semicircular tabs 44 are spaced inwardly from each of the sidewalls 28, 30. Each retaining latch 38, 42 also includes a tab 46 spaced inwardly from the sidewalls 32, 34, respectively. Similarly, each retaining latch 40 includes a tab 47 spaced inwardly from the sidewalls 32, 34. Tabs 46 and 47 are also preferably semicircular in shape. Each of the sidewalls 28, 30, 32, 34 along with the tabs 44, 46, and 47 cooperate to define a part receiving area 48. Preferably, one or more of the latch members 38, 40 and 42 is deflectable by the die 10 in order to permit insertion of the part 13 onto the parts carrier strip 14 so that the part 13 will be secured to the carrier strip adjacent the part receiving area 48.

Figure 4:
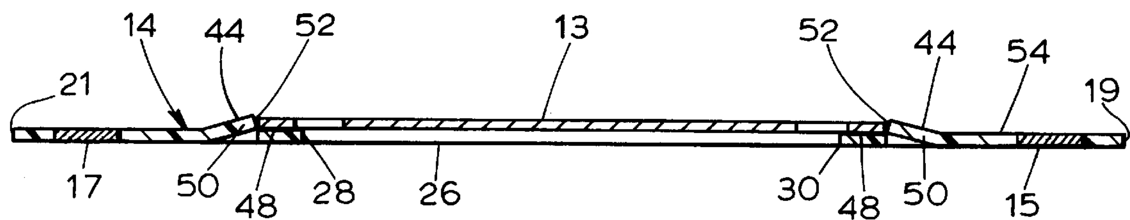
FIG. 4 is an enlarged cross-sectional view taken along lines 4—4 of FIG. 3.

Referring now to FIG. 4, tabs 44 are outwardly away from sidewalls 28, 30, respectively. Each tab 44 includes a shank portion 50 terminating in an edge 52 which is positioned to abut an adjacent edge of the part 13. Preferably, each tab 44 is punched or stamped in the surface of parts carrier strip 14 so that the edges 52 are positioned slightly above or away from the surface 54 of strip 14 at an angle. Tabs 44 thus function to prevent any lateral movement (to the left or right when viewing FIG. 4) of part 13 relative to the strip 14.

Figure 5:
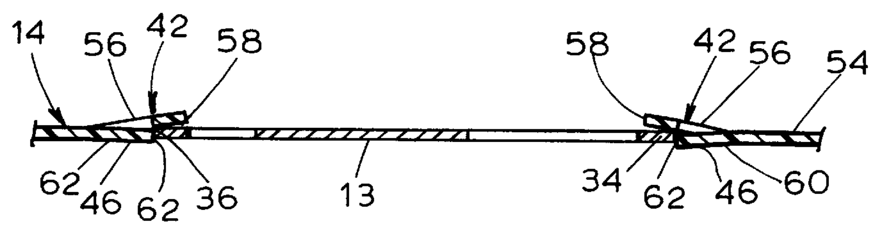
FIG. 5 is an enlarged cross-sectional view taken along lines 5—5 of FIG. 3.

Referring now to FIG. 5, retaining latch 42 is shown overlying a portion of the part 13. As can be seen from FIG. 3, the structure, function and operation of retaining latches 42 and 38 are essentially identical. Accordingly, only retaining latch 42 will be described in detail herein. Retaining latch 42 includes a shank portion 56 which terminates in an end 58. The end 58 is positioned to overlie an adjacent edge of the part 13, thereby securing the part 13 against upwardly vertical movement when viewing the drawing. The tab 46 is punched or stamped in the shank 60 of latch 42 and includes an edge 62 which is positioned slightly below the shank 60. Tab 46 extends away from the shank 60 at an angle, so that the edge 62 is positioned to abut an adjacent edge of the part 13. Tabs 46 thus function to prevent any lateral movement (to the left or right when viewing FIG. 5) of part 13 relative to the strip 14.

Figure 6:
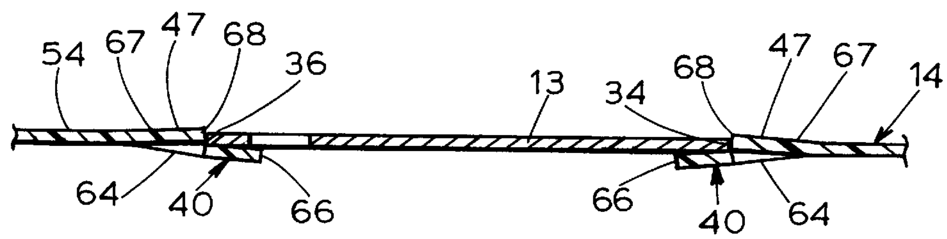
FIG. 6 is an enlarged cross-sectional view taken along lines 6—6 of FIG. 3.

Referring now to FIG. 6, retaining latch 40 is shown underlying a portion of the part 13. Retaining latch 40 includes a shank portion 64 which terminates in an end 66. The end 66 is positioned to underlie an adjacent edge of the part 13, thereby securing the part 13 against downwardly vertical movement when viewing the drawing. The tab 47 is punched or stamped in the shank 64 of latch 40 and includes a shank 67 terminating in an edge 68 which is positioned slightly above the shank 64 of the latch 40. The tab 47 extends away from the shank 64 of the latch 40, so that the edge 68 is positioned to abut an adjacent edge of the part 13. Tabs 47, along with the tabs 46 described above, thus function to prevent any lateral movement (to the left or right when viewing FIG. 5) of part 13 relative to the strip 14. Accordingly, tabs 44, 46 and 47, as shown in FIG. 3, cooperate to prevent any lateral movement of the part 13 relative to the surface 54 of parts carrier strip 14. Similarly, latches 3.8, 40 and 42 cooperate to secure the part 13 against any vertical movement relative to the surface 54 of the carrier strip 14.

In operation, the die 10 shown in FIG. 1 includes a series of forming stations (not shown) which sequentially stamp the metal strip 12 into parts 13, three of which are shown in FIG. 3 as parts 13, 13-1 and 13-2. The parts 13, 13-1 and 13-2 are stamped from the metal strip 12 in a manner similar to that which is discussed more fully in co-pending patent application Ser. No. 08/692,009. The die 10 also deflects one or more of the retaining latches 38, 40, 42 to permit the placement of the part 13 onto the part receiving area 48. The deflection of the latches 38, 40 and 42 is accomplished using a series of vertically reciprocating guides, pins or posts, again in a manner similar to that which is discussed in the co-pending patent application Ser. No. 08/692,009. Preferably, the latches 38 and 42 are deflected upwardly away from the surface 54 of the carrier strip 14 by the pins or posts (not shown), so that the part 13 may be placed onto the part receiving area 48. Upon retraction of the pins or posts, the resilient latches 38, 42 return to their original positions, so that the latches 38, 42 generally overlie the adjacent edge portions of the part 13. Accordingly, the part 13 is secured against vertical movement by the latches 38, 40 and 42, and is further secured against any lateral movement relative to the surface of the carrier strip 14 by the plurality of tabs 44, 46 and 47.

As should be evident from the foregoing, the carrier strip 14 will eventually be loaded with parts 13, 13-1, 13-2, etc., on the part receiving areas 48 adjacent each aperture 26. Thereafter, the carrier strip 14 can be rolled up onto reels and delivered to another location whereupon the parts 13, 13-1, 13-2, etc., can be removed from the part receiving areas 48. During transport, the parts are securely held to the carrier strip by the latches 38, 40 and 42 and the tabs 44, 46 and 47. Further, the parts are consistently presented in proper orientation to the assembly apparatus (not shown). Thereafter, if desired, the carrier strip can be reused, i.e., loaded with additional parts and again delivered to the assembly location. This reusability is a highly important feature of the present invention and can significantly reduce manufacturing costs. This feature results from the ability of the latches 38, 40 and 42 to deflect and return to their original shape without permanent deformation.

In addition to the foregoing, no secondary labor is required to load parts onto the carrier strip or otherwise perform a finishing operation thereon. Labor costs are low and packaging costs are held to a minimum since no adhesive, cover strips, etc. are used.

As noted above, dimensions of the strips 12 and/or 14 may vary according to the requirements of the particular application contemplated. Also, the carrier strip 14 need not be fabricated of plastic, but instead could be made of any material which is sufficiently resilient to allow the latches 38, 40 and 42 to deflect when a part is inserted onto the part receiving areas 48, and so that the tabs subsequently return to an undeflected position.

Also as noted above, the dimensions of the strips 12 and/or 14 and the sizes and shapes of the apertures, the part receiving areas, and the parts can be varied as needed and still obtain the unique benefits afforded by the present invention. For example, the parts may be circular, rectangular, square, completely flat or having only flat edge portions.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

What is claimed is:

1. A part carrier, comprising:

a flexible member capable of being flattened into a planar strip and including a plurality of part receiving areas, each part receiving area being defined by a plurality of part positioning tabs, each of the tabs abutting the edge of a pre-formed part placed adjacent the part receiving area; and each of the part receiving areas further being bounded on at least two opposing sides by a row of resiliently deflectable part retaining latches for releasably engaging the part, at least one of the latches in each row overlying the surface of the part and at least one of the latches in each row underlying the surface of the part.

2. The part carrier of claim 1, wherein at least one of the part positioning tabs along each of the part receiving area opposing sides is disposed on one of the retaining latches.

3. The part carrier of claim 1, wherein at least one of the latches in each row includes a part positioning tab.

4. The part carrier of claim 1, in combination with a flat pre-formed part placed adjacent one of the part receiving areas.

5. The part carrier of claim 4, wherein the part includes at least two opposing flat edge portions.

6. The part carrier of claim 1, wherein each of the part receiving areas includes an aperture extending through the member, the aperture permitting removal of the part from the part retaining area.

7. The part carrier of claim 1, wherein each of the positioning tabs includes an edge portion for abutting the part.

8. The part carrier of claim 7, wherein the edge portion is spaced away from the member.

9. The part carrier of claim 1, wherein the positioning tabs are semi-circular.

10. The part carrier of claim 1, wherein the member includes upper and lower surfaces, and further wherein one of the part positioning tabs is spaced upwardly away the upper surface and an other of the part positioning tabs is spaced downwardly away from the lower surface.

11. The part carrier of claim 1, wherein the member includes upper and lower surfaces and further wherein each of the part retaining latches includes a part positioning tab, each of the overlying latches having a downwardly spaced positioning tab and each of the underlying latches having an upwardly spaced positioning tab.

12. The part carrier of claim 1, wherein each row includes at least one underlying latch and a pair of overlying latches.

13. The part carrier of claim 12, wherein each of the overlying latches is deflectable away from the surface of the member to a part receiving position.

14. A part carrier for carrying a flat pre-formed part, comprising:

a flexible member capable of being flattened into a planar strip and having a plurality of upwardly facing part receiving surfaces, each of the part receiving surfaces being bounded by a pair of opposing rows of part retaining latches and further being bounded by opposing rows of substantially planar part positioning tabs, and wherein at least one of the part retaing latches in each row is resiliently deflectable between a part engaging position overlying the part and a part releasing position, and wherein at least another one of the part retaining latches in each row underlies the part.

15. The part carrier of claim 14, wherein each of the part positioning tabs includes an edge portion abutting the part.

16. The part carrier of claim 15, wherein the edge portion is spaced away from the part receiving surface.

17. The part carrier of claim 14, wherein the positioning tabs are semi-circular.

18. The part carrier of claim 14, wherein the part positioning tabs project at an acute angle away from the part receiving surface.

19. The part carrier of claim 14, wherein each of the rows includes a pair of resiliently deflectable latches.

20. The part carrier of claim 14, including an aperture extending through the member and being bounded by the part receiving surface, the aperture permitting removal of the part from the part receiving surface.

21. A part carrier, comprising:

a flexible member capable of being flattened into a planar strip and including a plurality of part receiving areas, each part receiving area being bounded on at least two sides by a plurality of substantially planar lateral retaining tabs defined in the planar strip and being adapted to laterally retain a pre-formed planar part placed adjacent the part receiving area; and a plurality of substantially planar and resiliently deflectable surface retaining members adapted to overlie and therefore engage the surface of the part thereby restraining the part against movement away from the part receiving area.

22. A part carrier for carrying a flat pre-formed part, comprising:

a flexible member capable of being flattened into a planar strip and having a plurality of upwardly facing part receiving surfaces, each of the part receiving surfaces being bounded by a pair of opposing rows of resiliently deflectable part retaining latches and further being bounded by opposing rows of part positioning tabs, each of the retaining latches including a downwardly facing part contacting surface, each of the retaining latches further including a part positioning tab projecting at an acute angle downwardly away from the part contacting surface, at least one of the part retaining latches in each row being resiliently deflectable between a part engaging position and a part releasing position.

23. The part carrier of claim 21, wherein each of the surface retaining members includes a downwardly facing part contacting surface, and further wherein a part positioning tab is defined in the downwardly facing part contacting surface, the positioning tab projecting at an acute angle downwardly away from the part contacting surface.

* * * * *